(12) United States Patent
Chaji et al.

(10) Patent No.: US 9,070,775 B2
(45) Date of Patent: Jun. 30, 2015

(54) THIN FILM TRANSISTOR (71) Applicant: Ignis Innovation Inc., Waterloo (CA)

(72) Inventors: Gholamreza Chaji, Waterloo (CA); Maryam Moradi, Melrose, MA (US)

(73) Assignee: Ignis Innovations Inc., Waterloo, Ontario (CA)

( * ) Notice: Subject to any disclaimer, the term of this patent is extended or adjusted under 35 U.S.C. 154(b) by 0 days.

(21) Appl. No.: 14/245,203

(22) Filed: Apr. 4, 2014

(65) Prior Publication Data

US 2014/0217409 A1 Aug. 7, 2014

Related U.S. Application Data (63) Continuation-in-part of application No. 13/563,930, filed on Aug. 1, 2012, now Pat. No. 8,729,529.

(60) Provisional application No. 61/514,887, filed on Aug. 3, 2011, provisional application No. 61/931,778, filed on Jan. 27, 2014, provisional application No. 61/921,912, filed on Dec. 30, 2013.

(51) Int. Cl.
  *H01L 29/78* (2006.01)
  *H01L 29/786* (2006.01)
  (Continued)

(52) U.S. Cl.
  CPC .... *H01L 29/78654* (2013.01); *H01L 29/78696* (2013.01); *H01L 51/0048* (2013.01); *H01L 29/0673* (2013.01); *H01L 51/0508* (2013.01); *H01L 29/413* (2013.01); *B82Y 10/00* (2013.01)

(58) Field of Classification Search
  CPC ................ H01L 27/12; H01L 27/1214; H01L 29/66757; H01L 29/66765; H01L 29/78696
  USPC ........................ 257/27, 57, E29.299, E21.414
  See application file for complete search history.

(56) References Cited

U.S. PATENT DOCUMENTS 4,354,162 A 10/1982 Wright
4,758,831 A 7/1988 Kasahara et al.
(Continued)

FOREIGN PATENT DOCUMENTS

CA 1294034 1/1992
CA 2109951 11/1992
(Continued)

OTHER PUBLICATIONS

European Search Report and Written Opinion for Application No. 08 86 5338 mailed Nov. 2, 2011 (7 pages).
(Continued)

*Primary Examiner* — Monica D Harrison
(74) *Attorney, Agent, or Firm* — Nixon Peabody LLP (57) ABSTRACT

A thin film transistor comprises a semiconductor layer; first and second dielectric layers disposed on opposite sides of the semiconductor layer; a first metal layer forming first and second terminals on the opposite side of the first dielectric layer from the semiconductor layer, one of said first and second terminals extending through said first dielectric layer into contact with the semiconductor layer, the first and second terminals and the first dielectric layer forming a capacitor; and a second metal layer forming a third terminal on the opposite side of the second dielectric layer from the semiconductor layer. The first and second terminals may be source and drain terminals, and the third terminal may be a gate terminal. The first metal layer may be divided to form the first and second terminals. The third terminal may be shared with one of the first and second terminals.

6 Claims, 6 Drawing Sheets

(51) Int. Cl.
*H01L 29/06* (2006.01)
*H01L 51/05* (2006.01)
*B82Y 10/00* (2011.01)
*H01L 51/00* (2006.01)
*H01L 29/41* (2006.01)

(56) References Cited

U.S. PATENT DOCUMENTS

| | | |
|---|---|---|
| 4,963,860 A | 10/1990 | Stewart |
| 4,975,691 A | 12/1990 | Lee |
| 4,996,523 A | 2/1991 | Bell et al. |
| 5,051,739 A | 9/1991 | Hayashida et al. |
| 5,222,082 A | 6/1993 | Plus |
| 5,266,515 A | 11/1993 | Robb et al. |
| 5,498,880 A | 3/1996 | Lee et al. |
| 5,589,847 A | 12/1996 | Lewis |
| 5,619,033 A | 4/1997 | Weisfield |
| 5,648,276 A | 7/1997 | Hara et al. |
| 5,670,973 A | 9/1997 | Bassetti et al. |
| 5,686,935 A | 11/1997 | Weisbrod |
| 5,712,653 A | 1/1998 | Katoh et al. |
| 5,714,968 A | 2/1998 | Ikeda |
| 5,747,928 A | 5/1998 | Shanks et al. |
| 5,748,160 A | 5/1998 | Shieh et al. |
| 5,784,042 A | 7/1998 | Ono et al. |
| 5,790,234 A | 8/1998 | Matsuyama |
| 5,815,303 A | 9/1998 | Berlin |
| 5,870,071 A | 2/1999 | Kawahata |
| 5,874,803 A | 2/1999 | Garbuzov et al. |
| 5,880,582 A | 3/1999 | Sawada |
| 5,903,248 A | 5/1999 | Irwin |
| 5,917,280 A | 6/1999 | Burrows et al. |
| 5,923,794 A | 7/1999 | McGrath et al. |
| 5,952,789 A | 9/1999 | Stewart et al. |
| 5,990,629 A | 11/1999 | Yamada et al. |
| 6,023,259 A | 2/2000 | Howard et al. |
| 6,069,365 A | 5/2000 | Chow et al. |
| 6,081,131 A | 6/2000 | Ishii |
| 6,091,203 A | 7/2000 | Kawashima et al. |
| 6,097,360 A | 8/2000 | Holloman |
| 6,144,222 A | 11/2000 | Ho |
| 6,157,583 A | 12/2000 | Starnes et al. |
| 6,166,489 A | 12/2000 | Thompson et al. |
| 6,177,915 B1 | 1/2001 | Beeteson et al. |
| 6,225,846 B1 | 5/2001 | Wada et al. |
| 6,229,508 B1 | 5/2001 | Kane |
| 6,232,939 B1 | 5/2001 | Saito et al. |
| 6,246,180 B1 | 6/2001 | Nishigaki |
| 6,252,248 B1 | 6/2001 | Sano et al. |
| 6,259,424 B1 | 7/2001 | Kurogane |
| 6,274,887 B1 | 8/2001 | Yamazaki et al. |
| 6,288,696 B1 | 9/2001 | Holloman |
| 6,300,928 B1 | 10/2001 | Kim |
| 6,303,963 B1 | 10/2001 | Ohtani et al. |
| 6,306,694 B1 | 10/2001 | Yamazaki et al. |
| 6,307,322 B1 | 10/2001 | Dawson et al. |
| 6,316,786 B1 | 11/2001 | Mueller et al. |
| 6,320,325 B1 | 11/2001 | Cok et al. |
| 6,323,631 B1 | 11/2001 | Juang |
| 6,323,832 B1 | 11/2001 | Nishizawa et al. |
| 6,345,085 B1 | 2/2002 | Yeo et al. |
| 6,348,835 B1 | 2/2002 | Sato et al. |
| 6,365,917 B1 | 4/2002 | Yamazaki |
| 6,373,453 B1 | 4/2002 | Yudasaka |
| 6,384,427 B1 | 5/2002 | Yamazaki et al. |
| 6,392,617 B1 | 5/2002 | Gleason |
| 6,399,988 B1 | 6/2002 | Yamazaki |
| 6,414,661 B1 | 7/2002 | Shen et al. |
| 6,420,758 B1 | 7/2002 | Nakajima |
| 6,420,834 B2 | 7/2002 | Yamazaki et al. |
| 6,420,988 B1 | 7/2002 | Azami et al. |
| 6,433,488 B1 | 8/2002 | Bu |
| 6,445,376 B2 | 9/2002 | Parrish |
| 6,468,638 B2 | 10/2002 | Jacobsen et al. |
| 6,489,952 B1 | 12/2002 | Tanaka et al. |
| 6,501,098 B2 | 12/2002 | Yamazaki |
| 6,501,466 B1 | 12/2002 | Yamagishi et al. |
| 6,512,271 B1 | 1/2003 | Yamazaki et al. |
| 6,518,594 B1 | 2/2003 | Nakajima et al. |
| 6,524,895 B2 | 2/2003 | Yamazaki et al. |
| 6,531,713 B1 | 3/2003 | Yamazaki |
| 6,559,594 B2 | 5/2003 | Fukunaga et al. |
| 6,573,195 B1 | 6/2003 | Yamazaki et al. |
| 6,573,584 B1 | 6/2003 | Nagakari et al. |
| 6,576,926 B1 | 6/2003 | Yamazaki et al. |
| 6,580,408 B1 | 6/2003 | Bae et al. |
| 6,580,657 B2 | 6/2003 | Sanford et al. |
| 6,583,775 B1 | 6/2003 | Sekiya et al. |
| 6,583,776 B2 | 6/2003 | Yamazaki et al. |
| 6,587,086 B1 | 7/2003 | Koyama |
| 6,593,691 B2 | 7/2003 | Nishi et al. |
| 6,594,606 B2 | 7/2003 | Everitt |
| 6,597,203 B2 | 7/2003 | Forbes |
| 6,611,108 B2 | 8/2003 | Kimura |
| 6,617,644 B1 | 9/2003 | Yamazaki et al. |
| 6,618,030 B2 | 9/2003 | Kane et al. |
| 6,641,933 B1 | 11/2003 | Yamazaki et al. |
| 6,661,180 B2 | 12/2003 | Koyama |
| 6,661,397 B2 | 12/2003 | Mikami et al. |
| 6,670,637 B2 | 12/2003 | Yamazaki et al. |
| 6,677,713 B1 | 1/2004 | Sung |
| 6,680,577 B1 | 1/2004 | Inukai et al. |
| 6,687,266 B1 | 2/2004 | Ma et al. |
| 6,690,344 B1 | 2/2004 | Takeuchi et al. |
| 6,693,388 B2 | 2/2004 | Oomura |
| 6,693,610 B2 | 2/2004 | Shannon et al. |
| 6,697,057 B2 | 2/2004 | Koyama et al. |
| 6,720,942 B2 | 4/2004 | Lee et al. |
| 6,734,636 B2 | 5/2004 | Sanford et al. |
| 6,738,034 B2 | 5/2004 | Kaneko et al. |
| 6,738,035 B1 | 5/2004 | Fan |
| 6,771,028 B1 | 8/2004 | Winters |
| 6,777,712 B2 | 8/2004 | Sanford et al. |
| 6,780,687 B2 | 8/2004 | Nakajima et al. |
| 6,806,638 B2 | 10/2004 | Lih et al. |
| 6,806,857 B2 | 10/2004 | Sempel et al. |
| 6,809,706 B2 | 10/2004 | Shimoda |
| 6,859,193 B1 | 2/2005 | Yumoto |
| 6,861,670 B1 | 3/2005 | Ohtani et al. |
| 6,873,117 B2 | 3/2005 | Ishizuka |
| 6,873,320 B2 | 3/2005 | Nakamura |
| 6,878,968 B1 | 4/2005 | Ohnuma |
| 6,909,114 B1 | 6/2005 | Yamazaki |
| 6,909,419 B2 | 6/2005 | Zavracky et al. |
| 6,919,871 B2 | 7/2005 | Kwon |
| 6,937,215 B2 | 8/2005 | Lo |
| 6,940,214 B1 | 9/2005 | Komiya et al. |
| 6,943,500 B2 | 9/2005 | LeChevalier |
| 6,954,194 B2 | 10/2005 | Matsumoto et al. |
| 6,956,547 B2 | 10/2005 | Bae et al. |
| 6,995,510 B2 | 2/2006 | Murakami et al. |
| 6,995,519 B2 | 2/2006 | Arnold et al. |
| 7,022,556 B1 | 4/2006 | Adachi |
| 7,023,408 B2 | 4/2006 | Chen et al. |
| 7,027,015 B2 | 4/2006 | Booth, Jr. et al. |
| 7,034,793 B2 | 4/2006 | Sekiya et al. |
| 7,088,051 B1 | 8/2006 | Cok |
| 7,106,285 B2 | 9/2006 | Naugler |
| 7,116,058 B2 | 10/2006 | Lo et al. |
| 7,129,914 B2 | 10/2006 | Knapp et al. |
| 7,129,917 B2 | 10/2006 | Yamazaki et al. |
| 7,141,821 B1 | 11/2006 | Yamazaki et al. |
| 7,193,589 B2 | 3/2007 | Yoshida et al. |
| 7,199,516 B2 | 4/2007 | Seo et al. |
| 7,220,997 B2 | 5/2007 | Nakata |
| 7,235,810 B1 | 6/2007 | Yamazaki et al. |
| 7,245,277 B2 | 7/2007 | Ishizuka |
| 7,248,236 B2 | 7/2007 | Nathan et al. |
| 7,264,979 B2 | 9/2007 | Yamagata et al. |
| 7,274,345 B2 | 9/2007 | Imamura et al. |
| 7,274,363 B2 | 9/2007 | Ishizuka et al. |
| 7,279,711 B1 | 10/2007 | Yamazaki et al. |
| 7,304,621 B2 | 12/2007 | Oomori et al. |
| 7,310,092 B2 | 12/2007 | Imamura |

(56) References Cited

U.S. PATENT DOCUMENTS

| | | |
|---|---|---|
| 7,315,295 B2 | 1/2008 | Kimura |
| 7,317,429 B2 | 1/2008 | Shirasaki et al. |
| 7,319,465 B2 | 1/2008 | Mikami et al. |
| 7,321,348 B2 | 1/2008 | Cok et al. |
| 7,339,636 B2 | 3/2008 | Voloschenko et al. |
| 7,355,574 B1 | 4/2008 | Leon et al. |
| 7,358,941 B2 | 4/2008 | Ono et al. |
| 7,385,224 B2 * | 6/2008 | Ishii et al. ............... 257/72 |
| 7,402,467 B1 | 7/2008 | Kadono et al. |
| 7,414,600 B2 | 8/2008 | Nathan et al. |
| 7,432,885 B2 | 10/2008 | Asano et al. |
| 7,474,285 B2 | 1/2009 | Kimura |
| 7,485,478 B2 | 2/2009 | Yamagata et al. |
| 7,502,000 B2 | 3/2009 | Yuki et al. |
| 7,535,449 B2 | 5/2009 | Miyazawa |
| 7,554,512 B2 | 6/2009 | Steer |
| 7,569,849 B2 | 8/2009 | Nathan et al. |
| 7,619,594 B2 | 11/2009 | Hu |
| 7,619,597 B2 | 11/2009 | Nathan et al. |
| 7,697,052 B1 | 4/2010 | Yamazaki et al. |
| 7,825,419 B2 | 11/2010 | Yamagata et al. |
| 7,859,492 B2 | 12/2010 | Kohno |
| 7,868,859 B2 | 1/2011 | Tomida et al. |
| 7,876,294 B2 | 1/2011 | Sasaki et al. |
| 7,948,170 B2 | 5/2011 | Striakhilev et al. |
| 7,969,390 B2 | 6/2011 | Yoshida |
| 7,995,010 B2 | 8/2011 | Yamazaki et al. |
| 8,044,893 B2 | 10/2011 | Nathan et al. |
| 8,378,362 B2 | 2/2013 | Heo et al. |
| 8,493,295 B2 | 7/2013 | Yamazaki et al. |
| 8,497,525 B2 | 7/2013 | Yamagata et al. |
| 2001/0002703 A1 | 6/2001 | Koyama |
| 2001/0004190 A1 | 6/2001 | Nishi et al. |
| 2001/0013806 A1 | 8/2001 | Notani |
| 2001/0015653 A1 | 8/2001 | De Jong et al. |
| 2001/0020926 A1 | 9/2001 | Kuijk |
| 2001/0026127 A1 | 10/2001 | Yoneda et al. |
| 2001/0026179 A1 | 10/2001 | Saeki |
| 2001/0026257 A1 | 10/2001 | Kimura |
| 2001/0030323 A1 | 10/2001 | Ikeda |
| 2001/0033199 A1 | 10/2001 | Aoki |
| 2001/0038098 A1 | 11/2001 | Yamazaki et al. |
| 2001/0043173 A1 | 11/2001 | Troutman |
| 2001/0045929 A1 | 11/2001 | Prache et al. |
| 2001/0052606 A1 | 12/2001 | Sempel et al. |
| 2001/0052898 A1 | 12/2001 | Osame et al. |
| 2002/0000576 A1 | 1/2002 | Inukai |
| 2002/0011796 A1 | 1/2002 | Koyama |
| 2002/0011799 A1 | 1/2002 | Kimura |
| 2002/0011981 A1 | 1/2002 | Kuijk |
| 2002/0015031 A1 | 2/2002 | Fujita et al. |
| 2002/0015032 A1 | 2/2002 | Koyama et al. |
| 2002/0030528 A1 | 3/2002 | Matsumoto et al. |
| 2002/0030647 A1 | 3/2002 | Hack et al. |
| 2002/0036463 A1 | 3/2002 | Yoneda et al. |
| 2002/0047852 A1 | 4/2002 | Inukai et al. |
| 2002/0048829 A1 | 4/2002 | Yamazaki et al. |
| 2002/0050795 A1 | 5/2002 | Imura |
| 2002/0053401 A1 | 5/2002 | Ishikawa et al. |
| 2002/0070909 A1 | 6/2002 | Asano et al. |
| 2002/0080108 A1 | 6/2002 | Wang |
| 2002/0084463 A1 | 7/2002 | Sanford et al. |
| 2002/0101172 A1 | 8/2002 | Bu |
| 2002/0101433 A1 | 8/2002 | McKnight |
| 2002/0113248 A1 | 8/2002 | Yamagata et al. |
| 2002/0122308 A1 | 9/2002 | Ikeda |
| 2002/0130686 A1 | 9/2002 | Forbes |
| 2002/0154084 A1 | 10/2002 | Tanaka et al. |
| 2002/0158823 A1 | 10/2002 | Zavracky et al. |
| 2002/0163314 A1 | 11/2002 | Yamazaki et al. |
| 2002/0180369 A1 | 12/2002 | Koyama |
| 2002/0180721 A1 | 12/2002 | Kimura et al. |
| 2002/0186214 A1 | 12/2002 | Siwinski |
| 2002/0190332 A1 | 12/2002 | Lee et al. |
| 2002/0190924 A1 | 12/2002 | Asano et al. |
| 2002/0190971 A1 | 12/2002 | Nakamura et al. |
| 2002/0195967 A1 | 12/2002 | Kim et al. |
| 2002/0195968 A1 | 12/2002 | Sanford et al. |
| 2003/0020413 A1 | 1/2003 | Oomura |
| 2003/0030603 A1 | 2/2003 | Shimoda |
| 2003/0062524 A1 | 4/2003 | Kimura |
| 2003/0063081 A1 | 4/2003 | Kimura et al. |
| 2003/0076048 A1 | 4/2003 | Rutherford |
| 2003/0090445 A1 | 5/2003 | Chen et al. |
| 2003/0090447 A1 | 5/2003 | Kimura |
| 2003/0090481 A1 | 5/2003 | Kimura |
| 2003/0095087 A1 | 5/2003 | Libsch |
| 2003/0107560 A1 | 6/2003 | Yumoto et al. |
| 2003/0111966 A1 | 6/2003 | Mikami et al. |
| 2003/0122745 A1 | 7/2003 | Miyazawa |
| 2003/0140958 A1 | 7/2003 | Yang et al. |
| 2003/0151569 A1 | 8/2003 | Lee et al. |
| 2003/0169219 A1 | 9/2003 | LeChevalier |
| 2003/0174152 A1 | 9/2003 | Noguchi |
| 2003/0179626 A1 | 9/2003 | Sanford et al. |
| 2003/0197663 A1 | 10/2003 | Lee et al. |
| 2003/0206060 A1 | 11/2003 | Suzuki |
| 2003/0230980 A1 | 12/2003 | Forrest et al. |
| 2004/0027063 A1 | 2/2004 | Nishikawa |
| 2004/0056604 A1 | 3/2004 | Shih et al. |
| 2004/0066357 A1 | 4/2004 | Kawasaki |
| 2004/0070557 A1 | 4/2004 | Asano et al. |
| 2004/0080262 A1 | 4/2004 | Park et al. |
| 2004/0080470 A1 | 4/2004 | Yamazaki et al. |
| 2004/0090400 A1 | 5/2004 | Yoo |
| 2004/0108518 A1 | 6/2004 | Jo |
| 2004/0113903 A1 | 6/2004 | Mikami et al. |
| 2004/0129933 A1 | 7/2004 | Nathan et al. |
| 2004/0130516 A1 | 7/2004 | Nathan et al. |
| 2004/0135749 A1 | 7/2004 | Kondakov et al. |
| 2004/0145547 A1 | 7/2004 | Oh |
| 2004/0150592 A1 | 8/2004 | Mizukoshi et al. |
| 2004/0150594 A1 | 8/2004 | Koyama et al. |
| 2004/0150595 A1 | 8/2004 | Kasai |
| 2004/0155841 A1 | 8/2004 | Kasai |
| 2004/0174347 A1 | 9/2004 | Sun et al. |
| 2004/0174349 A1 | 9/2004 | Libsch |
| 2004/0183759 A1 | 9/2004 | Stevenson et al. |
| 2004/0189627 A1 | 9/2004 | Shirasaki et al. |
| 2004/0196275 A1 | 10/2004 | Hattori |
| 2004/0201554 A1 | 10/2004 | Satoh |
| 2004/0207615 A1 | 10/2004 | Yumoto |
| 2004/0239596 A1 | 12/2004 | Ono et al. |
| 2004/0252089 A1 | 12/2004 | Ono et al. |
| 2004/0257355 A1 | 12/2004 | Naugler |
| 2004/0263437 A1 | 12/2004 | Hattori |
| 2005/0007357 A1 | 1/2005 | Yamashita et al. |
| 2005/0035709 A1 | 2/2005 | Furuie et al. |
| 2005/0067970 A1 | 3/2005 | Libsch et al. |
| 2005/0067971 A1 | 3/2005 | Kane |
| 2005/0068270 A1 | 3/2005 | Awakura |
| 2005/0088085 A1 | 4/2005 | Nishikawa et al. |
| 2005/0088103 A1 | 4/2005 | Kageyama et al. |
| 2005/0110420 A1 | 5/2005 | Arnold et al. |
| 2005/0117096 A1 | 6/2005 | Voloschenko et al. |
| 2005/0140598 A1 | 6/2005 | Kim et al. |
| 2005/0140610 A1 | 6/2005 | Smith et al. |
| 2005/0145891 A1 | 7/2005 | Abe |
| 2005/0156831 A1 | 7/2005 | Yamazaki et al. |
| 2005/0168416 A1 | 8/2005 | Hashimoto et al. |
| 2005/0206590 A1 | 9/2005 | Sasaki et al. |
| 2005/0225686 A1 | 10/2005 | Brummack et al. |
| 2005/0260777 A1 | 11/2005 | Brabec et al. |
| 2005/0269959 A1 | 12/2005 | Uchino et al. |
| 2005/0269960 A1 | 12/2005 | Ono et al. |
| 2005/0285822 A1 | 12/2005 | Reddy et al. |
| 2005/0285825 A1 | 12/2005 | Eom et al. |
| 2006/0007072 A1 | 1/2006 | Choi et al. |
| 2006/0012310 A1 | 1/2006 | Chen et al. |
| 2006/0027807 A1 | 2/2006 | Nathan et al. |
| 2006/0030084 A1 | 2/2006 | Young |
| 2006/0038758 A1 | 2/2006 | Routley et al. |
| 2006/0066527 A1 | 3/2006 | Chou |
| 2006/0092185 A1 | 5/2006 | Jo et al. |

(56) References Cited

U.S. PATENT DOCUMENTS

| | | |
|---|---|---|
| 2006/0232522 A1 | 10/2006 | Roy et al. |
| 2006/0261841 A1 | 11/2006 | Fish |
| 2006/0264143 A1 | 11/2006 | Lee et al. |
| 2006/0273997 A1 | 12/2006 | Nathan et al. |
| 2006/0284801 A1 | 12/2006 | Yoon et al. |
| 2007/0001937 A1 | 1/2007 | Park et al. |
| 2007/0001939 A1 | 1/2007 | Hashimoto et al. |
| 2007/0008268 A1 | 1/2007 | Park et al. |
| 2007/0046195 A1 | 3/2007 | Chin et al. |
| 2007/0069998 A1 | 3/2007 | Naugler et al. |
| 2007/0080905 A1 | 4/2007 | Takahara |
| 2007/0080906 A1 | 4/2007 | Tanabe |
| 2007/0080908 A1 | 4/2007 | Nathan et al. |
| 2007/0080918 A1 | 4/2007 | Kawachi et al. |
| 2007/0103419 A1 | 5/2007 | Uchino et al. |
| 2007/0182671 A1 | 8/2007 | Nathan et al. |
| 2007/0187760 A1* | 8/2007 | Furuta et al. .............. 257/347 |
| 2007/0273294 A1 | 11/2007 | Nagayama |
| 2007/0285359 A1 | 12/2007 | Ono |
| 2007/0296672 A1 | 12/2007 | Kim et al. |
| 2008/0042948 A1 | 2/2008 | Yamashita et al. |
| 2008/0055209 A1 | 3/2008 | Cok |
| 2008/0074413 A1 | 3/2008 | Ogura |
| 2008/0088549 A1 | 4/2008 | Nathan et al. |
| 2009/0032807 A1 | 2/2009 | Shinohara et al. |
| 2009/0051283 A1 | 2/2009 | Cok et al. |
| 2009/0160743 A1 | 6/2009 | Tomida et al. |
| 2009/0213046 A1 | 8/2009 | Nam |
| 2010/0052524 A1 | 3/2010 | Kinoshita |
| 2010/0079711 A1 | 4/2010 | Tanaka |
| 2010/0097335 A1 | 4/2010 | Jung et al. |
| 2010/0156279 A1 | 6/2010 | Tamura et al. |
| 2010/0328294 A1 | 12/2010 | Sasaki et al. |
| 2011/0090210 A1 | 4/2011 | Sasaki et al. |
| 2011/0180825 A1 | 7/2011 | Lee et al. |
| 2012/0212468 A1 | 8/2012 | Govil |
| 2013/0009930 A1 | 1/2013 | Cho et al. |
| 2013/0032831 A1 | 2/2013 | Chaji et al. |
| 2013/0113785 A1 | 5/2013 | Sumi |

FOREIGN PATENT DOCUMENTS

| | | |
|---|---|---|
| CA | 2 249 592 | 7/1998 |
| CA | 2 368 386 | 9/1999 |
| CA | 2 242 720 | 1/2000 |
| CA | 2 354 018 | 6/2000 |
| CA | 2 436 451 | 8/2002 |
| CA | 2 438 577 | 8/2002 |
| CA | 2 483 645 | 12/2003 |
| CA | 2 463 653 | 1/2004 |
| CA | 2498136 | 3/2004 |
| CA | 2522396 | 11/2004 |
| CA | 2443206 | 3/2005 |
| CA | 2472671 | 12/2005 |
| CA | 2567076 | 1/2006 |
| CA | 2526782 | 4/2006 |
| CN | 1381032 | 11/2002 |
| DE | 20 2006 00542 | 6/2006 |
| EP | 0 940 796 | 9/1999 |
| EP | 1 028 471 A | 8/2000 |
| EP | 1 103 947 | 5/2001 |
| EP | 1 130 565 A1 | 9/2001 |
| EP | 1 184 833 | 3/2002 |
| EP | 1 194 013 | 4/2002 |
| EP | 1 310 939 | 5/2003 |
| EP | 1 335 430 A1 | 8/2003 |
| EP | 1 372 136 | 12/2003 |
| EP | 1 381 019 | 1/2004 |
| EP | 1 418 566 | 5/2004 |
| EP | 1 429 312 A | 6/2004 |
| EP | 1 439 520 | 7/2004 |
| EP | 1 465 143 A | 10/2004 |
| EP | 1 467 408 | 10/2004 |
| EP | 1 517 290 | 3/2005 |
| EP | 1 521 203 A2 | 4/2005 |
| GB | 2 205 431 | 12/1988 |
| JP | 09 090405 | 4/1997 |
| JP | 10-153759 | 6/1998 |
| JP | 10-254410 | 9/1998 |
| JP | 11 231805 | 8/1999 |
| JP | 11-282419 | 10/1999 |
| JP | 2000/056847 | 2/2000 |
| JP | 2000-077192 | 3/2000 |
| JP | 2000-089198 | 3/2000 |
| JP | 2000-352941 | 12/2000 |
| JP | 2002-91376 | 3/2002 |
| JP | 2002-268576 | 9/2002 |
| JP | 2002-278513 | 9/2002 |
| JP | 2002-333862 | 11/2002 |
| JP | 2003-022035 | 1/2003 |
| JP | 2003-076331 | 3/2003 |
| JP | 2003-150082 | 5/2003 |
| JP | 2003-177709 | 6/2003 |
| JP | 2003-271095 | 9/2003 |
| JP | 2003-308046 | 10/2003 |
| JP | 2005-057217 | 3/2005 |
| TW | 485337 | 5/2002 |
| TW | 502233 | 9/2002 |
| TW | 538650 | 6/2003 |
| TW | 569173 | 1/2004 |
| WO | WO 94/25954 | 11/1994 |
| WO | WO 9948079 | 9/1999 |
| WO | WO 01/27910 A1 | 4/2001 |
| WO | WO 02/067327 A | 8/2002 |
| WO | WO 03/034389 A | 4/2003 |
| WO | WO 03/063124 | 7/2003 |
| WO | WO 03/077231 | 9/2003 |
| WO | WO 03/105117 | 12/2003 |
| WO | WO 2004/003877 | 1/2004 |
| WO | WO 2004/034364 | 4/2004 |
| WO | WO 2005/022498 | 3/2005 |
| WO | WO 2005/029455 | 3/2005 |
| WO | WO 2005/055185 | 6/2005 |
| WO | WO 2006/053424 | 5/2006 |
| WO | WO 2006/063448 A | 6/2006 |
| WO | WO 2006/137337 | 12/2006 |
| WO | WO 2007/003877 A | 1/2007 |
| WO | WO 2007/079572 | 7/2007 |
| WO | WO 2010/023270 | 3/2010 |

OTHER PUBLICATIONS

European Search Report for European Application No. EP 04 78 6661 dated Mar. 9, 2009.

European Search Report for European Application No. EP 05 75 9141 dated Oct. 30, 2009.

European Search Report for European Application No. EP 05 82 1114 dated Mar. 27, 2009 (2 pages).

European Search Report for European Application No. EP 07 71 9579 dated May 20, 2009.

European Search Report mailed Mar. 26, 2012 in corresponding European Patent Application No. 10000421.7 (6 pages).

Extended European Search Report mailed Apr. 27, 2011 issued during prosecution of European patent application No. 09733076.5 (13 pages).

International Search Report for International Application No. PCT/CA02/00180 dated Jul. 31, 2002 (3 pages).

International Search Report for International Application No. PCT/CA2004/001741 dated Feb. 21, 2005.

International Search Report for International Application No. PCT/CA2005/001844 dated Mar. 28, 2006 (2 pages).

International Search Report for International Application No. PCT/CA2005/001007 dated Oct. 18, 2005.

International Search Report for International Application No. PCT/CA2007/000652 dated Jul. 25, 2007.

International Search Report for International Application No. PCT/CA2008/002307, mailed Apr. 28, 2009 (3 pages).

International Search Report for International Application No. PCT/IB2011/055135, Canadian Patent Office, dated Apr. 16, 2012 (5 pages).

(56) References Cited

OTHER PUBLICATIONS

International Search Report mailed Jul. 30, 2009 for International Application No. PCT/CA2009/000501 (4 pages).
Machine English translation of JP 2002-333862, 49 pages.
Nathan et al.: "Thin film imaging technology on glass and plastic" ICM 2000, Proceedings of the 12$^{th}$ International Conference on Microelectronics, (IEEE Cat. No. 00EX453), Tehran Iran; dated Oct. 31-Nov. 2, 2000, pp. 11-14, ISBN: 964-360-057-2, p. 13, col. 1, line 11-48; (4 pages).
Office Action issued in Chinese Patent Application 200910246264.4 Dated Jul. 5, 2013; 8 pages.
Patent Abstracts of Japan, vol. 1997, No. 08, Aug. 29, 1997, & JP 09 090405 A, Apr. 4, 1997 Abstract.
Patent Abstracts of Japan, vol. 1999, No. 13, Nov. 30, 1999, & JP 11 231805 A, Aug. 27, 1999 Abstract.
Patent Abstracts of Japan, vol. 2000, No. 09, Oct. 13, 2000—JP 2000 172199 A, Jun. 3, 2000, abstract.
Sanford, James L., et al., "4.2 TFT AMOLED Pixel Circuits and Driving Methods", SID 03 Digest, ISSN/0003, 2003, pp. 10-13.
Tatsuya Sasaoka et al., 24.4L; Late-News Paper: A 13.0-inch AM-OLED Display with Top Emitting Structure and Adaptive Current Mode Programmed Pixel Circuit (TAC)', SID 01 Digest, (2001), pp. 384-387.
Zhiguo Meng et al; "24.3: Active-Matrix Organic Light-Emitting Diode Display implemented Using Metal-Induced Unilaterally Crystallized Polycrystalline Silicon Thin-Film Transistors", SID 01Digest, (2001), pp. 380-383.

* cited by examiner

THIN FILM TRANSISTOR

CROSS-REFERENCE TO RELATED APPLICATION

This application is a continuation-in-part of U.S. application Ser. No. 13/563,930, filed Aug. 1, 2012, now allowed, which claims the benefit of U.S. Provisional Application No. 61/514,887, filed Aug. 3, 2011, and claims the benefit of U.S. Provisional Applications Nos. 61/931,778, filed Jan. 27, 2014, and of 61/921,912, filed Dec. 30, 2013, all of which are hereby incorporated by reference herein in their entirety.

FIELD OF THE INVENTION

The present disclosure generally relates to thin film transistors.

BACKGROUND

Displays can be created from an array of organic light emitting devices ("OLEDs") each controlled by individual circuits (i.e., pixel circuits) having transistors for selectively controlling the circuits to be programmed with display information and to emit light according to the display information. Thin film transistors ("TFTs") fabricated on a substrate can be incorporated into such displays.

Mobility characterizes the responsiveness of a charge carrier in the presence of an electric field. Mobility is generally expressed in units of $cm^2/V \cdot s$. For transistors, the mobility of the channel region provides a measure of the performance of the transistor "on" current, e.g., the current that can be supplied by the transistor. In thin film transistors, a layer of semiconductor material is generally utilized to form the channel region.

Development of OLED display devices is challenged by the demand for a suitable drive transistor in the pixel circuits. Amorphous silicon (a-Si), the transistor channel material that sources the voltage to switch AM-LCD pixels, has a low mobility ($\sim 0.1\ cm^2\ V^{-1}\ s^{-1}$). Organic semiconductor channel materials are attractive for use as pixel circuit drive transistors for their homogeneity, low cost, and the variety of means by which they can be deposited, but their best mobilities are similar to that of a-Si. In a typical TFT architecture, low-mobility channel layers would require a large source-drain voltage to drive the necessary current. This consumes power in the transistor (as opposed to light production in the OLED), compromising the power savings.

P-type a-Si TFTs can have even lower mobility values, and can be as low as $0.01\ cm^2\ V^{-1}\ s^{-1}$.

SUMMARY

According to one embodiment, a thin film transistor comprises a semiconductor layer; first and second dielectric layers disposed on opposite sides of the semiconductor layer; a first metal layer forming first and second terminals on the opposite side of the first dielectric layer from the semiconductor layer, one of said first and second terminals extending through said first dielectric layer into contact with the semiconductor layer, the first and second terminals and the first dielectric layer forming a capacitor; and a second metal layer forming a third terminal on the opposite side of the second dielectric layer from the semiconductor layer. In one implementation, the first and second terminals are source and drain terminals, and the third terminal is a gate terminal. The first metal layer may be divided to form the first and second terminals. The third terminal may be shared with one of the first and second terminals.

In another embodiment, a thin film transistor comprises a semiconductor layer; first and second dielectric layers disposed on opposite sides of the semiconductor layer, at least the second dielectric layer having openings therein; a first metal layer forming a first terminal on the opposite side of the first dielectric layer from the semiconductor layer; and a second metal layer forming a second terminal on the opposite side of the second dielectric layer from the semiconductor layer, with the second metal layer extending through the openings in the second dielectric layer to contact the semiconductor layer.

The foregoing and additional aspects and embodiments of the present invention will be apparent to those of ordinary skill in the art in view of the detailed description of various embodiments and/or aspects, which is made with reference to the drawings, a brief description of which is provided next.

BRIEF DESCRIPTION OF THE DRAWINGS

The foregoing and other advantages of the invention will become apparent upon reading the following detailed description and upon reference to the drawings.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

Figure 1:
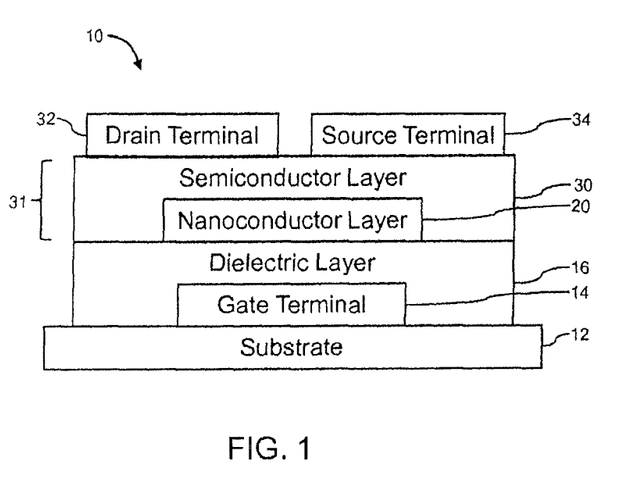
FIG. 1 illustrates a block diagram of a bottom gate thin film transistor having a channel region including a nanoconductor layer.

FIG. 1 illustrates a block diagram of a bottom-gate thin film transistor 10 having a channel region 31 including a nanoconductor layer 20. The thin film transistor 10 can generally be formed by deposition or a similar process on a substrate 12 of a display. For example, the substrate 12 can be a back plane substrate or an encapsulation glass substrate, or another suitable substrate providing a surface on which the TFT 10 can be developed. A gate terminal 14 is formed on the substrate 12. The gate terminal 14 is a conductive electrode for receiving signals to operate the TFT 10. The signals applied to the gate terminal 14 can be binary "high" or "low" signals turning the TFT 10 on or off or can be signals at a plurality of levels to control the amount of current conveyed through the drain and source terminals.

A dielectric layer 16 ("insulating layer") is developed over the gate terminal 14 to prevent current flow to or from the gate terminal 14 and the channel region 31 of the TFT 10. The dielectric layer 16 can be developed by a deposition process. A layer of nanoconductors, i.e., a nanoconductor layer 20, is then placed ("positioned") on the dielectric layer 16. The nanoconductor layer 20 generally includes a plurality of nanoconductors and can include nanowires, nanofibers, and/or nanotubes, such as single-wall nanotubes ("SWNT"), double-wall nanotubes ("DWNT") and/or multi-wall nanotubes ("MWNT"). The nanoconductors can be formed of Carbon and/or Silicon and can optionally incorporate doping materials to modify the conductive properties of the nanoconductors. The nanoconductor layer 20 can be a single layer (i.e., monolayer) of nanoconductors.

A semiconductor layer 30 is developed over the nanoconductor layer 20. Together, the semiconductor layer 30 and the nanoconductor layer 20 form the two-layer channel region 31 of the TFT 10. For example, the semiconductor layer 30 can be made from organic or inorganic semiconductor materials. The semiconductor layer 30 can be formed of, for example, amorphous silicon or polysilicon. The semiconductor layer 30 can also incorporate doping to modify the mobility characteristics of the TFT 10.

The drain terminal 32 and source terminal 34 of the TFT are then formed on the semiconductor layer. The drain terminal 32 and the source terminal 34 are each formed of a conductive material suitable for conveying electrical energy. The terminals 32, 34 can be, for example, metallic. A channel separation distance is defined by the distance between the drain terminal 32 and the source terminal 34. The channel separation distance is one parameter that influences the operation performance of the TFT 10.

The TFT 10 is referred to as a bottom-gate TFT because the gate 14 is formed directly on the substrate 12, and thus the side of the TFT 10 having the gate 14 is referred to as a bottom side of the TFT 10, while the side of the TFT 10 having the drain and source terminals 32, 34 is referred to as a top side of the TFT 10.

Figure 2:
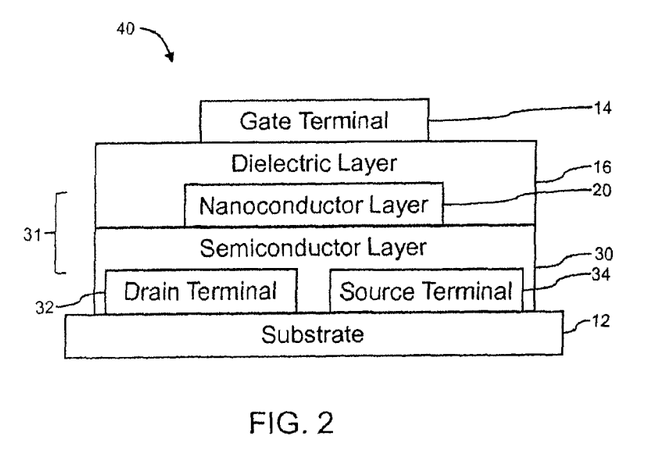
FIG. 2 illustrates a block diagram of a top gate thin film transistor having a channel region including a nanoconductor layer.

FIG. 2 illustrates a block diagram of a top-gate thin film transistor 40 having a channel region 31 including a nanoconductor layer 20. The top-gate TFT 40 is manufactured by applying the layered components discussed in connection with the bottom-gate TFT 10 shown in FIG. 1 in the reverse order. The drain terminal 32 and source terminal 34 are each formed on the substrate 12. The semiconductor layer 30 is then deposited on the drain and source terminals 32, 34. The nanoconductor layer 20 is then applied to the semiconductor layer 30 to form the two-layer channel region 31. By applying the nanoconductor layer 20 to the surface of the semiconductor layer 30 opposite the drain and source terminals 32, 34, the nanoconductor layer 20 is positioned to lack any direct contact with the drain and source terminals 32, 34. Thus, during low field effect operation (e.g., low gate-source voltages), the performance of the TFT is dominated by the semiconductor layer because the nanoconductors lack any direct contact with the source or drain terminal of the TFT. The TFT therefore offers good leakage current performance, similar to the performance of the semiconductor layer 30. The dielectric layer 16 is then developed on the nanoconductor side of the channel region 31 and the gate terminal 14 is formed on the dielectric layer 16.

Moreover, the nanoconductors the nanoconductor layer can change the polarity of the TFT device. For example, carbon nanotubes have a p-type characteristic. An amorphous silicon (a-Si) TFT formed with its channel region including carbon nanotubes can therefore have a p-type characteristic. A p-type a-Si TFT so formed can be highly beneficial to a-Si TFT applications due to the enhanced mobility of such a p-type transistor compared to conventional p-type TFTs. The enhanced mobility of such a p-type transistor compared to conventional p-type TFTs can advantageously allow such p-type a-Si TFTs to be utilized in AMOLED display applications previously dominated by n-type TFTs and thereby enable p-type pixel circuit architectures.

Figure 3A:
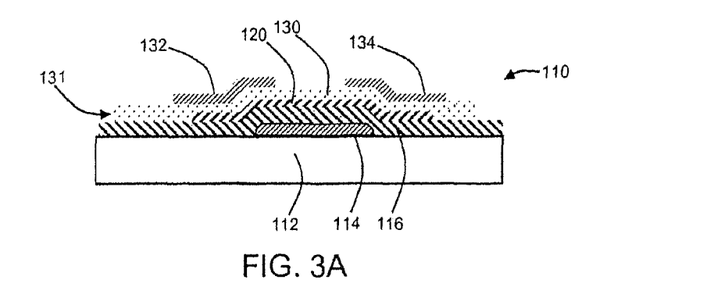
FIG. 3A is a schematic illustration of a cross-section view of a thin film transistor 110 having a channel region including a nanoconductor layer.

FIG. 3A is a schematic illustration of a cross-section view of a thin film transistor 110 ("TFT") having a channel region 131 including a nanoconductor layer 120. In the schematic illustration in FIG. 3A, the components of the TFT 110 are numbered with reference numbers one-hundred higher than the corresponding components of the TFT 10 in the block diagram of FIG. 1. The TFT 110 is formed on a substrate 112, which can be substrate of a display, such as a back plane substrate, a transparent planarization substrate, or an encapsulation glass substrate. A gate terminal 114 is formed on the substrate 112. The gate terminal 114 can be a conductive terminal with characteristics similar to the characteristics of the gate terminal 14 described in connection with FIG. 1. A dielectric layer 116 is developed on the gate terminal 114 to insulate the gate terminal 114 from the channel region 131 of the TFT 110. The dielectric layer 116 can be an electrical insulator.

The channel region 131 of the TFT has two layers: a nanoconductor layer 120 and a semiconductor layer 130. The semiconductor layer 130 separates the nanoconductor layer 120 from direct contact with the drain terminal 132 or the source terminal 134. The nanoconductor layer 120 generally includes a plurality of nanowires, nanofibers, and/or nanotubes. The individual nanoconductors ("nanoparticles") in the nanoconductor layer 120 are placed on the dielectric layer 116 in a thin film. The individual nanoconductors are each desirably aligned generally in a direction oriented from the drain terminal 132 to the source terminal 134 to increase the efficacy of charge transfer between the drain and source terminals 132, 134.

Figure 3B:
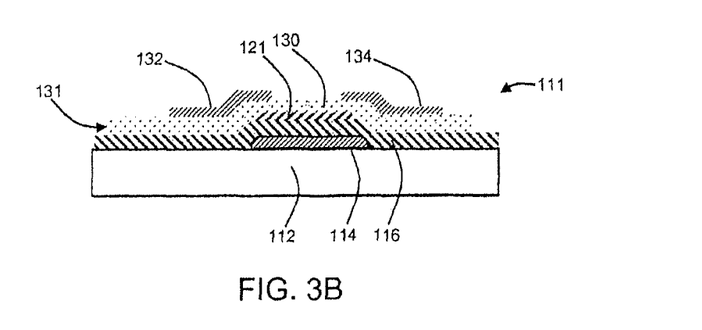
FIG. 3B is a schematic illustration of a thin film transistor similar to the one illustrated in FIG. 3A, but with a shorter nanoconductor layer.

FIG. 3B is a schematic illustration of a thin film transistor 111 similar to the one illustrated in FIG. 3A, but with a shorter nanoconductor layer 121. The schematic illustration in FIG. 3B illustrates that the drain and source terminals 132, 134 can overlap the nanoconductor layer 121 by varying amounts. By adjusting the dimensional extent of the nanoconductor layer 121 along a direction oriented from the drain terminal 132 to the source terminal 134, the charge transfer characteristics of the two-layer channel region 131 can be modified. For example, the two-layer channel region 131 can provide for relatively more charge transfer (e.g., increased mobility) by increasing the dimensional extent (e.g., length) of the nanoconductor layer 121, by increasing the density of nanoconductors within the nanoconductor layer 121, and/or by increasing the amount of overlap with the drain terminal 132 and/or source terminal 134. As discussed herein, the amount of overlap between the nanoconductor layer 121 and the drain and source terminals 132, 134 refers to the amount of surface area of the drain/source terminals 132, 134 which is separated from the nanoconductor layer 121 only by a vertical path through the semiconductor layer 130. In FIGS. 3A and 3B, the vertical direction through the semiconductor layer 130 is the direction outwardly normal to the substrate 112.

Aspects of the present disclosure further provide that the nanoconductor layer 121 can be configured with a dimensional extent along the direction oriented from the drain terminal 132 to the source terminal 134 to not overlap either of the drain or source terminals 132, 134. For example, the length of the nanoconductor layer 121 can be less than the separation distance between the drain terminal 132 and the source terminal 134. Additional configurations of the nanoconductor layer 121 are illustrated generally by the top view schematic illustrations in FIG. 4A through 4C.

Figure 4A:
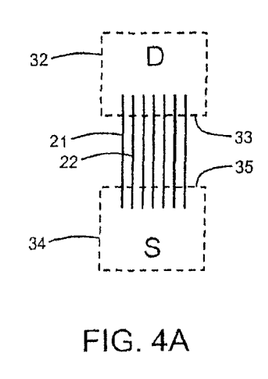
FIG. 4A is a schematic illustration of a top view of a nanoconductor layer with a characteristic length exceeding the separation between the drain and source terminals of the TFT.

FIG. 4A is a schematic illustration of a top view of a nanoconductor layer with a characteristic length exceeding the separation between the drain and source terminals of the TFT. While the nanoconductor layer 20 is illustrated for schematic purposes with individual nanoconductors (e.g., the nanoconductors 21, 22) of uniform length and each aligned between the drain terminal 32 and the source terminal 34, the present disclosure is no so limited. Aspects of the present disclosure apply to configurations with a nanoconductor layer 20 having individual nanoconductors of non-uniform length and orientation. The schematic illustration of the nanoconductor layer 20 in FIG. 4A also illustrates that the individual nanoconductors (e.g., the nanoconductors 21, 22) are disposed in a monolayer. The nanoconductor layer 20 can be a dispersed monolayer of nanoconductors that covers less than a full cross-sectional area of the two-layer channel region. For example, the gaps between the individual nanoconductors (e.g., the nanoconductors 21, 22) can be of roughly the same size as the widths of the nanoconductors themselves such that the individual nanoconductors (e.g., the nanoconductors 21, 22) in the nanoconductor layer 20 cumulatively cover approximately half (e.g., 50%) of the two-layer channel region. In an implementation, any gaps between the individual nanoconductors (e.g., the nanoconductors 21, 22) are filled by the semiconductor layer deposited over the nanoconductor layer 20. The nanoconductor layer 20 can be implemented with coverage of greater or lesser than 50% coverage, such as 30% coverage or 70% coverage. Generally, increasing the density of the monolayer of nanoconductors (e.g., the fraction of coverage) can increase the charge transfer characteristics of the two-layer channel region.

Figure 4B:
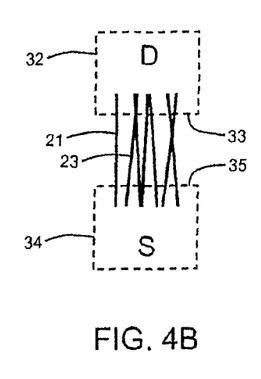
FIG. 4B is a schematic illustration of a top view of the nanoconductor layer similar to FIG. 4A, but where the individual nanoconductors are imperfectly aligned with a direction oriented from the drain terminal to the source terminal.
Figure 4C:
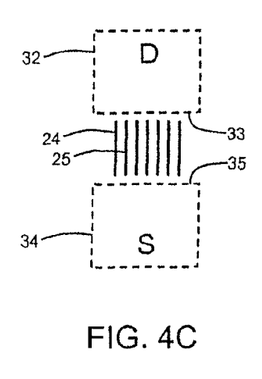
FIG. 4C is a schematic illustration of a top view of the nanoconductor layer similar to FIG. 4A, but where the characteristic length of the nanoconductor layer is less than the separation of the drain and source terminals of the TFT.

In FIGS. 4A through 4C, the hashed blocks labeled "D" and "S" represent the positions of the drain terminal 32 and source terminal 34, respectively. The drain terminal 32 has a channel side 33 and the source terminal 34 has a channel side 35. The distance between the channel side 33 of the drain terminal 32 and the channel side 35 of the source terminal 34 can be referred to for convenience as a channel separation distance. As shown in FIG. 4A, the length of the nanoconductor layer 20 can be greater than the channel separation distance between the drain terminal 32 and the source terminal 34 such that the drain terminal 32 and the source terminal 34 each overlap at least a portion of the nanoconductor layer 20. By overlapping at least a portion of the nanoconductor layer 20 with the drain/source terminals 32, 34, the nanoconductor layer 20 advantageously allows for a vertical connection path through the semiconductor layer to enhance the charge transfer characteristics of the two-layer channel region.

FIG. 4B is a schematic illustration of a top view of the nanoconductor layer similar to FIG. 4A, but where the individual nanoconductors (e.g., the nanoconductors 21, 23) are imperfectly aligned with a direction oriented from the drain terminal 32 to the source terminal 34. Because the nanoconductor layer 20 is not directly connected to either of the drain/source terminals 32, 34 (i.e., the nanoconductor layer 20 is connected to the drain/source terminals only through the semiconductor layer), the charge transfer characteristics of the two-layer channel region are relatively insensitive to precise alignment requirements of the individual nanoconductors (e.g., the nanoconductor 23). Thus, the nanoconductors (e.g., the nanoconductors 21, 23) generally enhance the effective mobility of the two-layer channel region by conveying charges to/from the drain/source terminals 32, 34 through the semiconductor layer such that the charge transfer characteristics of the thin film transistor is not limited by the mobility of the semiconductor layer.

Figure 5:
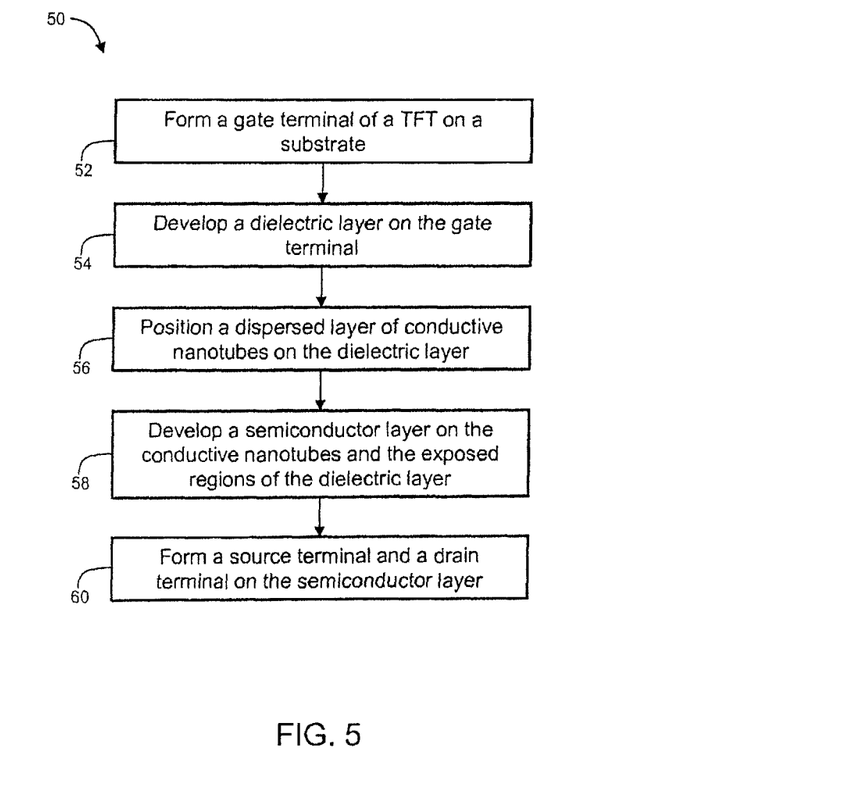
FIG. 5 is a flowchart illustrating an example process for manufacturing a thin film transistor having a channel region including a nanoconductor layer.

FIG. 4C is a schematic illustration of a top view of the nanoconductor layer similar to FIG. 4A, but where the characteristic length of the nanoconductor layer is less than the separation of the drain and source terminals of the TFT. In the schematic illustration in FIG. 4C, the individual nanoconductors (e.g., the nanoconductors 24, 25) are illustrated as having a length less than the channel separation distance. In the configuration illustrated in FIG. 4C, the nanoconductor layer 20 does not overlap either the drain terminal 32 or the source terminal 34. Thus, a charge transfer path does not exist from the drain/source terminals 32, 34 to the nanoconductor layer 20 that includes only a vertical charge transfer path through the semiconductor layer. For example, in the configuration illustrated in FIG. 4C, the effective mobility of the two-layer channel region can be limited by the requirement that charges are transferred laterally through the FIG. 5 is a flowchart 50 illustrating an example process for manufacturing a thin film transistor ("TFT") having a channel region including a nanoconductor layer. A gate terminal of a TFT is formed on a substrate in the first step 51. Next, a dielectric layer is developed on the gate terminal 54 in step 52. The dielectric layer coats the exposed surfaces of the gate terminal so as to prevent the two-layer channel region, which is deposited next, from directly contacting the gate terminal. A dispersed layer of nanoconductors, such as nanotubes or nanowires, are positioned on the dielectric layer in step 53. As discussed in connection with FIGS. 3A through 3C, the dispersed layer of nanoconductors can be a monolayer covering less than the full exposed area of the channel region. In step 54, a semiconductor layer is deposited on the nanoconductor layer and any exposed regions of the dielectric layer. The semiconductor layer can include amorphous silicon. The semiconductor layer and the nanoconductor layer thus jointly form the two-layer channel region. A source terminal and a drain terminal are then formed on the semiconductor layer in step 55. The source terminal and the drain terminal are thus formed so as to lack a direct connection with the nanoconductors.

The flowchart 50 is an example of a process for manufacturing a bottom-gate TFT (i.e., the gate terminal is deposited on the substrate). However, a similar process can be adapted to manufacture a top-gate TFT having a two-layer channel region incorporating nanoconductors that do not directly contact the drain or source terminals, such as the top-gate TFT 40 shown in FIG. 2. For example, a drain and a source terminal can be formed on a substrate. A semiconductor layer can be deposited over the drain and source terminals, and a nanoconductor layer can be placed over the semiconductor layer, thus forming a two-layer channel region. A dielectric layer can be deposited over the two-layer channel region, and a gate terminal can be formed on the dielectric layer.

Figure 6:
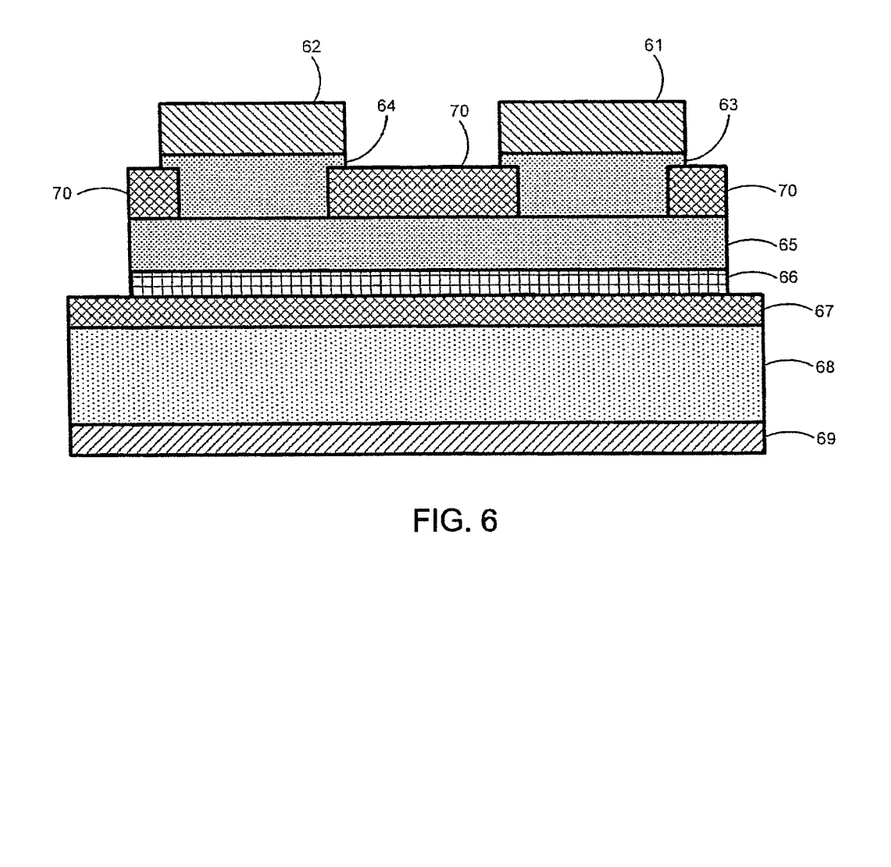
FIG. 6 is a diagrammatic cross section of a thin film transistor having a channel region including a nanoconductor layer.

FIG. 6 illustrates a modified structure in which metallic source and drain terminals 61 and 62 (e.g., aluminum having a thickness of about 100 nanometers) are formed on respective layers 63 and 64 of p+ silicon (e.g., with a thickness of about 35 nanometers). Directly beneath the layers 63 and 64 is a layer 65 of a semiconductor material (e.g., alternating nanocrystalline and amorphous silicon having a total thickness of about 30 nanometers), which is deposited on top of a layer 66 of nanoconductors such as carbon nanotubes (e.g., with a thickness of about 1 to 2 nanometers). The nanoconductors are deposited on top of a dielectric layer 67 (e.g., thermal silicon dioxide with a thickness of about 100 nanometers), which in turn is deposited on a substrate 68 (e.g., p+ silicon). The bottom surface of the substrate 67 is covered with a conductive back contact 69 (e.g., aluminum with a thickness of about 100 nanometers).

An exemplary process for forming the structure shown in FIG. 6 is as follows:

1. Thermal P$^+$ Silicon Substrate Cleaning
   (a) Ultrasonic cleaning of the substrate in acetone for 10 minutes, then in isopropyl alcohol (IPA) for another 10 minutes. This process is repeated twice.
   (b) Substrate is rinsed with deionized water and dried with nitrogen. Note: The substrate is put on a hotplate (~90° C.) for 10 minutes before the next step.
2. Carbon nanotube coating
   (a) Substrate treatment using amino-propyl tri-ethoxy silane (APTES).
      Before coating, the substrate is immersed into APTES solution (1% v/v in IPA) for 20 minutes, then the substrate is rinsed with IPA and dried with nitrogen.
   (b) Dip coating carbon nanotubes on APTES-treated substrate
      The substrate is immersed into carbon nanotubes solution for 15 minutes.
      Then the substrate is rinsed with abundant deionized water and dried with nitrogen.
      The carbon nanotube-coated substrate is baked on a hotplate at 180° C. for 20 minutes before it is loaded into a plasma enhanced chemical vapor deposition (PECVD) cluster.
3. Nanocrystalline amorphous silicon (nc-Si) and SiNx deposition using PECVD
   (a) nc-Si (~30 nm.)
      Gas: $SiH_4/H_2=40/200$ sccm; Pr=900 mtorr; $R_F$=2 W; T=210 C (set); Rate=4.07 nm/min.
   (b) SiNx (150 nm)
      Gas: $SiH_4/NH_3/N_2=5/100/50$ sccm; Pr=1000 mtorr; $R_F$=15 W; T=250 C (set); Rate=15 nm/min.
4. $SiN_x$ Via (Mask#1)
   (a) Photolithography
      Photoresist: NLOF 2035
      Spin: 500 rpm for 10 seconds followed by 4000 rmp for 90 seconds.
      Soft bake: 110° C. for 1 minute
      Contact: low vacuum.
      Exposure: 5.4 seconds.
      Post-exposure bake: 110° C.
      Develop: AZ300 MIF for ~30 seconds.
   (b) Wet etching $SiN_x$ using buffered hydrofluoric acid (BHF).
      The substrate is immersed in a BHF solution (10% v/v) for 27 seconds.
   (c) Strip of Photoresist
      The substrate is immersed in AZ KWIT stripper for 10 minutes, then rinsed by deionized water, acetone and IPA.
5. P$^+$ Deposition (~35 nm thickness)
   Gas: $SiH_4/B_2H_6/H2=1.8/1.8/200$ sccm; Pr=1500 mtorr; $R_F$=65 W; T=250 C, (set); Rate=7.7 nm/min.
6. S/D metal deposition (aluminum, ~100 nm thickness)
7. S/D patterning (Mask #1')
   Photoresist: AZ 3312
   Spin: 700 rpm for 10 seconds followed by 4000 rmp for 60 seconds.
   Soft bake: 90° C. for 1 minute.
   Contact: low vacuum.
   Exposure: 4 seconds.
   Post-exposure bake: 120° C. for 1 minute.
   Develop: AZ300 MIF for ~15 seconds.
   Etching: ~3 minutes in PAN etchant at room temperature.
   Strip: Rinsed in AZ KWIT stripper for 4 minutes, then rinsed with deionized water, acetone and IPA.
8. Separation of P using S/D Metal as hard mask.
   RIE dry-etching P+ silicon:
   $R_F$=50 W; $P_r$=20 mtorr; $CF_4/H_2$=20/3 sccm; rate=~0.43 nm/s
9. Device separation and isolation (Mask #2)
   (a) Photolithography
      Photoresist: AZ 3312.
      Spin: 700 rpm for 10 seconds followed by 4000 rmp for 60 seconds.
      Soft bake: 90° C. for 1 minute.
      Contact: low vacuum.
      Exposure: 4 seconds.
      Post-exposure bake: 120° C. for 1 minute.
      Develop: AZ300 MIF for ~15 seconds.
   (b) Dry-etching $SiN_x$/Si/carbon nanotubes.
      $R_F$=125 W; $P_r$=150 mtorr; $CF_4/O_2$=43/5 sccm; rate=~4 nm/s.
10. Back Contact Metal Deposition (aluminum, ~100 nm thickness)
    (a) Removal of back thermal oxide.
       The wafer front side is protected by PR AZ3312 before it is immersed into BHF (10% v/v) for 4 minutes.
    (b) Metal deposition on the back side of the wafer.
       After the thermal oxide on the back side of the wafer is removed by BHF, the wafer is loaded into a vacuum chamber immediately for the metal deposition.

Figure 7:
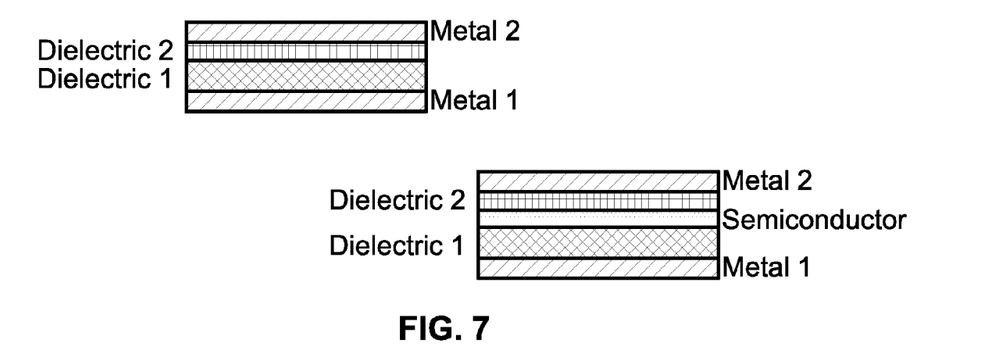
FIG. 7 is a pair of sectional views of two typical Metal-Insulator-Metal (MIM) capacitors.

In FIG. 7, a capacitance is formed between a semiconductor layer and at least one of two metal layers located on opposite sides of the semiconductor layer. Each metal layer is separated from the semiconductor layer by a dielectric layer. The main challenge is that the semiconductor is very resistive and, therefore, the RC delay associated with charging the capacitor will be high, resulting in lower frame rate or hysteresis.

Figure 8:
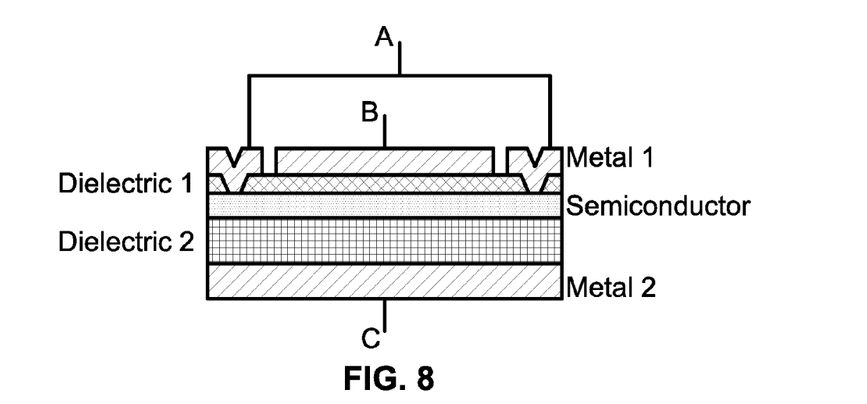
FIG. 8 is a sectional view of a structure having a high capacitance value.
Figure 9:
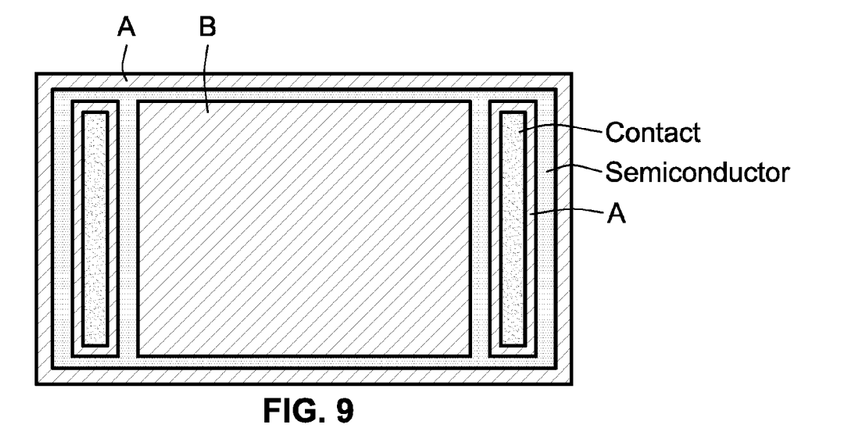
FIG. 9 is a plan view of the structure shown in FIG. 8.

To avoid the high RC delay, a three-terminal capacitor is used, as illustrated in FIGS. 8 and 9. The first metal layer, on one side of the semiconductor layer, is separated from the semiconductor layer by a first dielectric layer and forms a first terminal C that controls the resistivity of the semiconductor layer. The second metal layer, on the other side of the semiconductor layer, is separated from the semiconductor layer by a second dielectric layer. The second metal layer is divided to form second and third terminals B and A, forming a capacitor between terminals B and A. Terminal A extends through the second dielectric layer to contact the semiconductor layer.

In one example, terminal C is connected to a low or high voltage line in the panel, depending on the type of semiconductor (for example, low for p-type and high for n-type). In this case, the semiconductor layer resistance is significantly lowered by charge accumulation (or depletion). In another example, terminal C is shared with another terminal (B or A). In this case, one of those terminals has a voltage that reduces the resistance of the semiconductor material, depending on the type of the semiconductor.

In FIGS. 8 and 9 there are two contacts between the terminal A and the semiconductor layer, but one contact or more than two contacts can work as well (depending on the available area).

The order of layers can change, and FIGS. 8 and 9 show one example of the 3-terminal capacitor.

The voltage on the control terminal of the capacitor can be a fixed voltage or a toggling voltage. In the case of a toggling voltage, one can control the RC delay of charging and discharging the capacitance. For example, one can use a voltage that reduces the RC delay during charging of the capacitor, and then use a voltage for a holding period that makes the capacitance more stable. In this case, the characteristics of the capacitance are not changed significantly by a high voltage difference bias stress.

Figure 10:
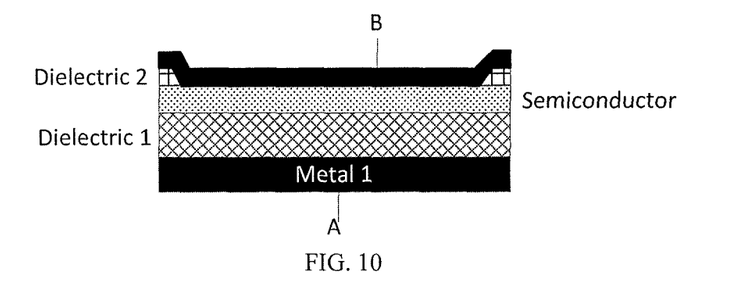
FIG. 10 is a sectional view of a modified structure having a high capacitance value.

FIG. 10 shows another structure that provides a high capacitance value without adding extra processing steps to the fabrication. Since the second dielectric 2 is generally thicker than the semiconductor layer, the traditional way of having stacked dielectric results in a smaller capacitor than using stacked semiconductor and dielectric. Here, the second dielectric is etched during patterning of that dielectric layer, and then the metal for the electrode B is deposited to make contact with the semiconductor layer through openings in the pattern. To have consistent capacitance, the electrodes B and A can be connected in a way that the voltage across the two electrodes A and B is always higher or lower than the threshold voltage of the formed metal-insulator-semiconductor capacitor. Thus, the semiconductor layer will always act as an insulator or conductor layer.

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

What is claimed is:

1. A thin film capacitor comprising
   a semiconductor layer having a controllable resistance,
   first and second dielectric layers disposed on opposite sides of the semiconductor layer,
   a first metal layer forming first and second terminals on the opposite side of the first dielectric layer from the semiconductor layer, said first terminal extending through said first dielectric layer into contact with the semiconductor layer, said second terminal not contacting said semiconductor layer
   a second metal layer forming a third terminal on the opposite side of the second dielectric layer from the semiconductor layer; and
   a voltage source coupled to one of said second and third terminals for reducing the resistance of said semiconductor layer, and the other of said second and third terminals forming a capacitor with said semiconductor layer.

2. The thin film capacitor of claim 1, wherein the first and second terminals are source and drain terminals, and said third terminal is a gate terminal.

3. The thin film capacitor of claim 1 in which said first metal layer is divided to form said first and second terminals.

4. The thin film capacitor of claim 1 in which said third terminal is shared with one of said first and second terminals.

5. The thin film capacitor of claim 1 in which said second and third terminals are connected, and a capacitor is formed between said semiconductor layer and said second and third terminals.

6. The thin film capacitor of claim 1 in which a source of a toggling voltage is connected to a terminal of said thin-film capacitor.

* * * * *